United States Patent
Wang et al.

(10) Patent No.: US 7,888,273 B1
(45) Date of Patent: Feb. 15, 2011

(54) DENSITY GRADIENT-FREE GAP FILL

(75) Inventors: Feng Wang, Fremont, CA (US); Victor Y. Lu, Santa Cruz, CA (US); Brian Lu, Fremont, CA (US); Wai-Fan Yau, Los Altos, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/834,581

(22) Filed: Aug. 6, 2007

Related U.S. Application Data

(60) Provisional application No. 60/856,193, filed on Nov. 1, 2006.

(51) Int. Cl.
*H01L 21/31* (2006.01)
*H01L 21/469* (2006.01)

(52) U.S. Cl. .................................. 438/778; 438/781
(58) Field of Classification Search ................. 438/438, 438/781, 423–424, 428, 436, 758
See application file for complete search history.

(56) References Cited

U.S. PATENT DOCUMENTS

| | | | |
|---|---|---|---|
| 4,740,480 A | 4/1988 | Ooka | |
| 5,320,983 A * | 6/1994 | Ouellet | 438/782 |
| 5,516,721 A | 5/1996 | Galli et al. | |
| 5,858,880 A | 1/1999 | Dobson et al. | |
| 5,874,367 A | 2/1999 | Dobson | |
| 5,899,751 A * | 5/1999 | Chang et al. | 438/758 |
| 5,902,127 A | 5/1999 | Park | |
| 5,932,289 A | 8/1999 | Dobson et al. | |
| 6,143,626 A | 11/2000 | Yabu et al. | |
| 6,218,268 B1 | 4/2001 | Xia et al. | |
| 6,242,366 B1 | 6/2001 | Beekman et al. | |
| 6,287,989 B1 | 9/2001 | Dobson | |
| 6,300,219 B1 | 10/2001 | Doan et al. | |
| 6,383,951 B1 * | 5/2002 | Li | 438/781 |
| 6,413,583 B1 | 7/2002 | Moghadam et al. | |
| 6,475,564 B1 | 11/2002 | Carter et al. | |
| 6,544,858 B1 | 4/2003 | Beekman et al. | |

(Continued)

OTHER PUBLICATIONS

Chang et al, Flowable oxide CVD Process for Shallow Trench Isolation in Silicon Semiconductor, Mar. 2004, Journal of Semiconductor Technology and Science, vol. 4 No. 1, pp. 45-51.*

(Continued)

*Primary Examiner*—Ha Tran T Nguyen
*Assistant Examiner*—Valerie Brown
(74) *Attorney, Agent, or Firm*—Weaver Austin Villeneuve & Sampson LLP

(57) ABSTRACT

Multi-cycle methods result in dense, seamless and void-free dielectric gap fill are provided. The methods involve forming liquid or flowable films that partially fill a gap, followed by a solidification and/or anneal process that uniformly densifies the just-formed film. The thickness of the layer formed is such that the subsequent anneal process creates a film that does not have a density gradient. The process is then repeated as necessary to wholly or partially fill or line the gap as desired. The methods of this invention may be used to line or fill high aspect ratio gaps, including gaps having aspect ratios greater than about 6:1 with widths less than about 0.13 μm.

18 Claims, 8 Drawing Sheets

U.S. PATENT DOCUMENTS

| | | | |
|---|---|---|---|
| 6,640,840 | B1 | 11/2003 | MacNeil |
| 6,653,247 | B2 | 11/2003 | MacNeil |
| 6,790,737 | B2 | 9/2004 | Schneegans et al. |
| 6,828,162 | B1 | 12/2004 | Halliyal et al. |
| 6,846,757 | B2 | 1/2005 | MacNeil |
| 6,984,561 | B2 | 1/2006 | Herner et al. |
| 7,056,560 | B2 | 6/2006 | Yim et al. |
| 7,074,690 | B1 | 7/2006 | Gauri et al. |
| 7,524,735 | B1 | 4/2009 | Gauri et al. |
| 7,582,555 | B1 | 9/2009 | Lang et al. |
| 7,629,227 | B1 | 12/2009 | Lang et al. |
| 2002/0006729 | A1 | 1/2002 | Geiger et al. |
| 2003/0146416 | A1 | 8/2003 | Takei et al. |
| 2004/0048455 | A1 | 3/2004 | Karasawa et al. |
| 2004/0152342 | A1 | 8/2004 | Li et al. |
| 2005/0136684 | A1 | 6/2005 | Mukai et al. |
| 2007/0281495 | A1* | 12/2007 | Mallick et al. .............. 438/778 |

OTHER PUBLICATIONS

U.S. Office Action mailed Aug. 23, 2005, from U.S. Appl. No. 10/810,066.
Lang et al., "CVD Flowable Gap Fill," Novellus Systems, Inc., U.S. Appl. No. 11/323,812, filed Dec. 29, 2005, pp. 1-21.
Notice of Allowance and Fee Due mailed Feb. 15, 2006 from U.S. Appl. No. 10/810,066.
Allowed Claims from U.S. Appl. No. 10/810,066.
Gauri et al., "Flowable Film Dielectric Gap Fill Process," Novellus Systems, Inc., U.S. Appl. No. 11/447,594, filed Jun. 5, 2006.
U.S. Office Action mailed Jun. 27, 2008, from U.S. Appl. No. 11/447,594.
U.S. Office Action mailed Oct. 26, 2007, from U.S. Appl. No. 11/323,812.
U.S. Office Action mailed Apr. 9, 2008, from U.S. Appl. No. 11/323,812.
U.S. Office Action mailed Oct. 9, 2008, from U.S. Appl. No. 11/323,812.
Wang, et al., "CVD Flowable Gap Fill," Novellus Systems, Inc., U.S. Appl. No. 11/925,514, filed Oct. 26, 2007.
Notice of Allowance and Fee Due mailed Feb. 15, 2006 from U.S. Appl. No. 11/447,594.
Allowed Claims from U.S. Appl. No. 11/447,594.
U.S. Office Action mailed Nov. 4, 2008, from U.S. Appl. No. 11/925,514.
Antonelli et al., "PECVD Flowable Dielectric Gap Fill," Novellus Systems, Inc., U.S. Appl. No. 12/334,726, filed Dec. 15, 2008.
Gauri et al., "Flowable Film Dielectric Gap Fill Process," Novellus Systems, Inc., U.S. Appl. No. 12/411,243, filed Mar. 25, 2009.
Notice of Allowance and Fee Due mailed Apr. 23, 2009 from U.S. Appl. No. 11/323,812.
Allowed Claims from U.S. Appl. No. 11/323,812.
U.S. Final Office Action mailed Jun. 17, 2009, from U.S. Appl. No. 11/925,514.
Notice of Allowance and Fee Due mailed Jul. 29, 2009 from U.S. Appl. No. 11/925,514.
Allowed Claims from U.S. Appl. No. 11/925,514.
Mui et al., "Flowable Oxide Deposition Using Rapid Delivery of Process Gases," Novellus Systems, Inc., U.S. Appl. No. 12/566,085, filed Sep. 24, 2009.
Lang et al., "CVD Flowable Gap Fill", Novellus Systems, Inc., U.S. Appl. No. 12/508,461, filed Jul. 23, 2009.
Chung, et al., "Flowable Oxide CVD Process for Shallow Trench Isolation in Silicon Semiconductor," Journal of Semiconductor Technology and Science, vol. 4, No. 1, Mar. 2004, pp. 45-51.
Wang et al., "CVD Flowable Gap Fill", Novellus Systems, Inc., U.S. Appl. No. 12/625,468, filed Nov. 24, 2009.
Mui et al., "Flowable Oxide Deposition Using Rapid Delivery of Process Gases", Novellus Systems, Inc., U.S. Appl. No. 12/566,085, filed Sep. 24, 2009.
U.S. Office Action mailed Feb. 26, 2010, from U.S. Appl. No. 12/334,726.
U.S. Office Action mailed May 24, 2010, for U.S. Appl. No. 12/411,243.
U.S. Final Office Action mailed Sep. 13, 2010 for U.S. Appl. No. 12/411,243.

* cited by examiner

US 7,888,273 B1

DENSITY GRADIENT-FREE GAP FILL

CROSS REFERENCE TO RELATED APPLICATIONS

This application claims priority under 35 U.S.C. §119(e) to U.S. Provisional Application No. 60/856,193, filed Nov. 1, 2006, which is incorporated by reference herein and for all purposes.

BACKGROUND OF THE INVENTION

This invention relates to electronic device fabrication processes. More specifically, the invention relates to chemical vapor deposition processes for forming dielectric layers in high aspect ratio, narrow width recessed features.

It is often necessary in semiconductor processing to fill or line high aspect ratio gaps with insulating material. This is the case for shallow trench isolation (STI) layers, inter-metal dielectric (IMD) layers, inter-layer dielectric (ILD) layers, passivation layers, etc. As device geometries shrink and thermal budgets are reduced, void-free filling or uniform lining of high aspect ratio spaces (e.g., AR>6:1) becomes increasingly difficult due to limitations of existing deposition processes.

One approach to gap fill is high-density plasma chemical vapor deposition (HDP CVD). HDP CVD is a directional (bottom-up) CVD process that is used for high aspect ratio gap-fill. The method deposits more material at the bottom of a high aspect ratio structure than on its sidewalls. It accomplishes this by directing charged dielectric precursor species downward, to the bottom of the gap while simultaneously removing deposited material from the trench top through sputtering by the use of biased RF power applied to the substrate. Nevertheless, HDP CVD gapfill results in the formation of cusps, also known as overhangs, at the entry region of the gap to be filled. This results from the non-directional deposition reactions of species in the plasma reactor and from sputtering and redeposition processes. The directional aspect of the deposition process produces some high momentum charged species that sputter away bottom fill. The sputtered material tends to redeposit on the sidewalls. As a result, the entry region of a high aspect ratio structure may close before bottom-up fill has been completed, leaving voids or weak spots within the structure. This phenomenon, known as "pinch-off," is exacerbated in narrow features. This problem is exacerbated in small features. Limitations due to overhang formation become ever more severe as the width of the gap to be filled decreases and the aspect ratio increases.

In addition to undesirable formations inside the feature, a peak of dielectric material often called a "top hat" forms on the top surface of the substrate on either side of the features. Top hats are deposits of material in the shape of a peak that slopes downwards towards the entry to the gap. If not removed, the top hats may "shadow" subsequent deposition because they can restrict the angles of incidence with which the deposition species must approach the gap in order to achieve bottom-up fill. The shadowing effectively makes the aspect ratio of the gap even higher.

To overcome limitations associated with the formation of overhangs and top-hats, HDP CVD processes often rely on in-situ plasma etch steps to remove the undesirable material. Some of these in-situ plasma etch processes use high-energy ions (e.g., helium from the HDP plasma) to create a significantly anisotropic sputter etch. Other in-situ plasma etch processes use chemically-reactive etch gases (e.g., nitrogen trifluoride, $NF_3$) to create a significantly isotropic plasma etch. After a layer of dielectric partially fills gaps on a substrate, the plasma species etch the layer to remove overhangs and top-hats and open the gap for further deposition. However, these etch steps may be inappropriate in some applications.

SUMMARY OF THE INVENTION

Multi-cycle methods that result in good, seamless and void-free dielectric gap fill are provided. The methods involve forming a liquid or flowable film that partially fills a gap, followed by a solidification and/or anneal process that uniformly densifies the just-formed film. The thickness of the layer formed is such that the subsequent anneal process results in a film that does not have a density gradient. The process is then repeated as necessary to wholly or partially fill or line the gap as desired.

In certain embodiments, multi-cycle processes in which a soft jelly-like liquid or flowable film is deposited to partially fill the gap are provided. The flowable film is then converted into a solid silicon oxide film by an anneal or cure process. The deposition and anneal operations are repeated as necessary to wholly or partially fill or line the gap as desired. Each deposition operation deposits only no more than a critical deposition thickness. The critical deposition thickness is the maximum thickness at which the subsequent anneal can uniformly densify the deposited film.

In certain embodiments, the gap is partially filled with dielectric film by a spin-on method. This film is then subjected to an anneal or cure process. The deposition and anneal operations are repeated as necessary to wholly or partially fill or line the gap as desired. Each deposition operation deposits only no more than a critical deposition thickness. The critical deposition thickness is the maximum thickness at which the subsequent anneal can uniformly densify the deposited film.

These and other features and advantages of the invention will be described in more detail below with reference to the associated drawings.

DETAILED DESCRIPTION OF THE INVENTION

Introduction

The present invention relates to deposition processes that provide dielectric gap fill of high aspect ratio (typically at least 6:1), narrow width (typically less than 0.13 um) gaps. The methods of the invention provide uniform, i.e. void-free and density gradient-free, gapfill.

Figure 1:
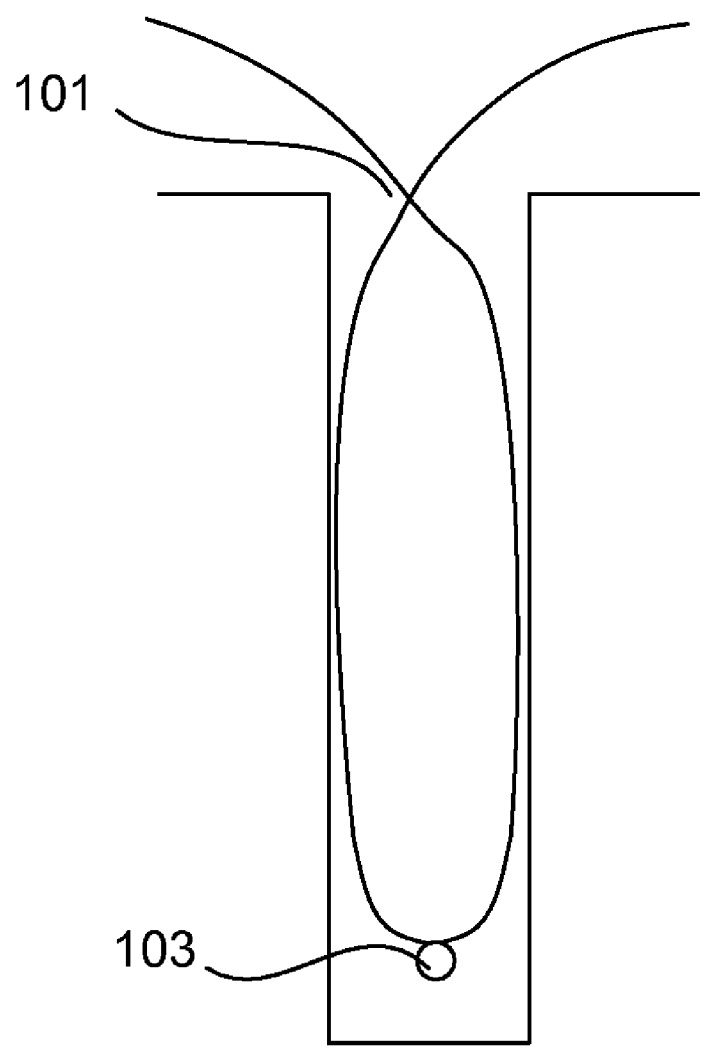
FIG. 1 is a rough schematic cross-sectional diagram of a trench partially filled by a conventional method.

The methods are particularly useful at technology nodes of 65 nm and below, for which conventional methods of dielectric gapfill may have various shortcomings. For example, neither conventional high density plasma chemical vapor deposition (HPD-CVD) nor sub-atmospheric CVD (SACVD) methods do provide void-free gapfill of high aspect ratio structures, especially of structures having re-entrant profiles. Those methods either deposit more material on the upper region than on the lower region of a sidewall or form cusps (also called overhangs) at the entry of the gap. FIG. 1 shows a rough schematic of a trench partially filled by such a process. Reference number 101 indicates where sidewalls have formed from film that has been sputtered away from the bottom of the trench and redeposited on the sidewalls of the trench. These sidewalls have pinched off preventing further deposition. Reference number 103 indicates a weak spot or void. Conventional gap fill methods often lead to the formation of weak spots in the dielectric film. Weak spots may form as a result of the increased gap volume to gap access area as the gap closes off, and can lead to voids or seams in the gap and ultimately device failure.

As indicated above, to overcome limitations associated with the formation of overhangs and top-hats, HDP CVD processes often rely on in-situ plasma etch steps to remove the undesirable material. Alternatives to HDP CVD deposition include atomic layer deposition (ALD) and rapid vapor deposition (RVD), also referred to as Pulsed Deposition Layer processing (PDL). ALD and PDL methods involve self-limiting adsorption of reactant gases and can provide conformal dielectric films within high aspect ratio features. One drawback to these methods is that the deposition rates are relatively low and the resulting throughput of the deposition tool is low. Another disadvantage is that although the ALD and PDL processes do not create overhangs or top-hats, the conformal nature of the processes results in the formation of seams in filled trenches. These seams may allow attack by post-gap-fill wet etch steps, resulting in polysilicon deposition in the seam during subsequent processing which would obviate its insulating effect.

Other methods of filling high aspect ratio gaps use include the deposition and treatment of flowable oxide films, by spin-coating and flow-coating for example. These flowable films are typically formed by applying a silicon-containing precursor onto a substrate, followed by a solidification or anneal/cure step. The solidification/anneal/cure step, which is often performed at high temperature, is necessary to convert the flowable film into a solid oxide layer. Flowable films may also require an additional re-flow step to ensure complete filling of the gap.

Methods of filling gaps by depositing flowable films in gaps are described in the U.S. Pat. No. 7,074,690, U.S. patent application Ser. No. 11/447,594, filed Jun. 5, 2006, U.S. patent application Ser. No. 11/323,812, filed Dec. 29, 2005 and U.S. Provisional Patent Application No. 60/856,193, filed Nov. 1, 2006, all of which are incorporated by reference herein in their entireties for all purposes. After deposition the flowable films are solidified, e.g., by a thermal anneal. However in filling high aspect ratio gaps (e.g., AR of greater than about 6:1) with narrow widths (e.g., less than about 0.13 um), the annealing fully converts only a top portion or layer of the flowable film into dense solid oxide. Much of the film below has sub-optimal density and is susceptible to wet etchant attack. The portion of the film that is not fully densified may also have a different composition due to the incorporation of precursor groups that were not fully removed due to insufficient anneal. The present invention provides multi-cycle methods that result in good, seamless and void-free gap fill. Also provided are methods of filling gaps that result in density gradient-free fill.

In certain embodiments, multi-cycle processes in which a soft jelly-like liquid or flowable film is deposited to partially fill the gap are provided. The flowable film is then converted into a solid silicon oxide film by an annealing or cure process. The deposition and anneal operations are repeated as necessary to wholly or partially fill or line the gap as desired. Each deposition operation deposits only no more than a critical deposition thickness. The critical deposition thickness is the maximum thickness at which the subsequent anneal can uniformly densify the deposited film.

In certain embodiments, the gap is partially filled with dielectric film by a spin-on method. This film is then subjected to an annealing or cure process. The deposition and anneal operations are repeated as necessary to wholly or partially fill or line the gap as desired. Each deposition operation deposits only no more than a critical deposition thickness. The critical deposition thickness is the maximum thickness at which the subsequent anneal can uniformly densify the deposited film.

The methods of the present invention enable gradient-free gap fill in narrow-width features with high aspect ratios.

Process

Figure 2:
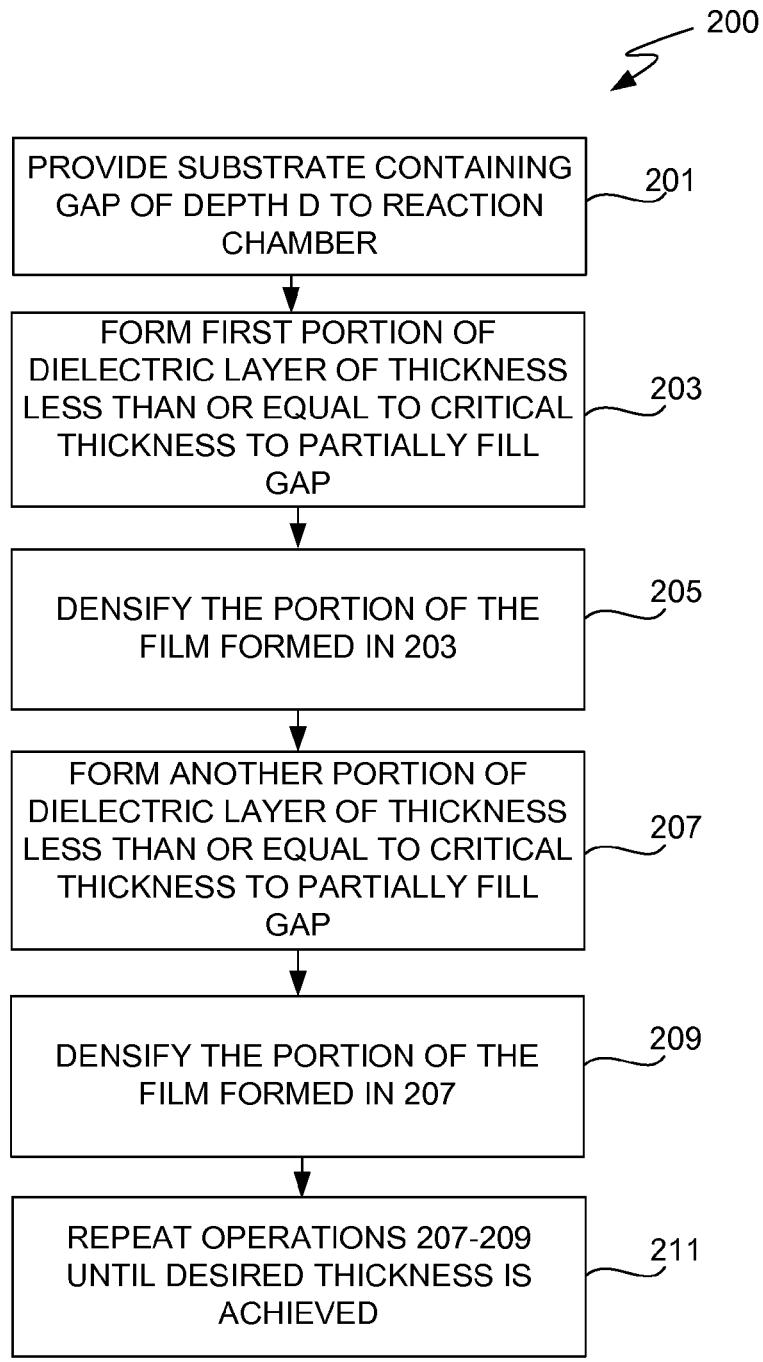
FIG. 2 is a process flow diagram depicting a method of filling a gap on a substrate according to certain embodiments.

FIG. 2 is a process flow sheet depicting a method according to certain embodiments. As shown, a process 200 begins at an operation 201 in which a substrate containing a gap is provided to a reaction chamber. Providing the substrate to the reactor may involve supporting and optionally clamping, the substrate to a pedestal or other support in the chamber. For this purpose, an electrostatic, vacuum or mechanical chuck may be employed. As indicated, the gap has a depth d. In many embodiments, the substrate contains many gaps, e.g., trenches or vias, having depth d.

After the substrate is provided to the reaction chamber, a first portion of a layer is formed to partially fill the gap in an operation 203. In a particular embodiment, the layer is formed by a spin-on glass technique. In another embodiment, the layer is formed by introducing a silicon-containing compound and an oxidant in the chamber at conditions such that a condensed flowable film is formed on the substrate and partially fills the gap. As indicated in FIG. 2, the portion of the layer formed in operation 203 is less than or equal to a critical thickness. The critical thickness is the maximum thickness at which the subsequent anneal process can substantially fully and uniformly densify the portion of the film deposited in operation 203.

The critical thickness is inversely related to ratio of the volume of film deposited to the surface area of the exposed film, and therefore depends on the feature size. As feature size decreases, this ratio increases and the critical thickness decreases. In features having aspect ratios between about 3:1-15:1, the critical feature width is between about 10 and 100 nm. In some cases in which the aspect ration is 6:1 or greater, the critical width is less than about 0.13 µm.

The portion of the film just deposited is then densified in an operation 205, by a cure/anneal process. According to various embodiments, this involves a steam, thermal, ultraviolet (UV), electron-beam (E-beam), microwave, laser or plasma anneal. Because the film in operation 203 is deposited at or less than the critical thickness, the anneal process uniformly densifies this portion of the film without a density gradient. Another portion of the film is then deposited on top of the first portion of the film in an operation 207, typically by the method used to deposit the first portion of the film. This second portion of the film is then densified in operation 209. At this point in the process, the gap is filled to a thickness of about twice the critical thickness, less some film shrinkage that may occur during the anneal (assuming that about the critical thickness is formed in each deposition operation). The deposited film is density gradient-free—unlike if the film were formed in a single operation. The film deposition-anneal-deposition-anneal operations are then repeated as necessary to fill the gap in operation 211.

Figure 3:
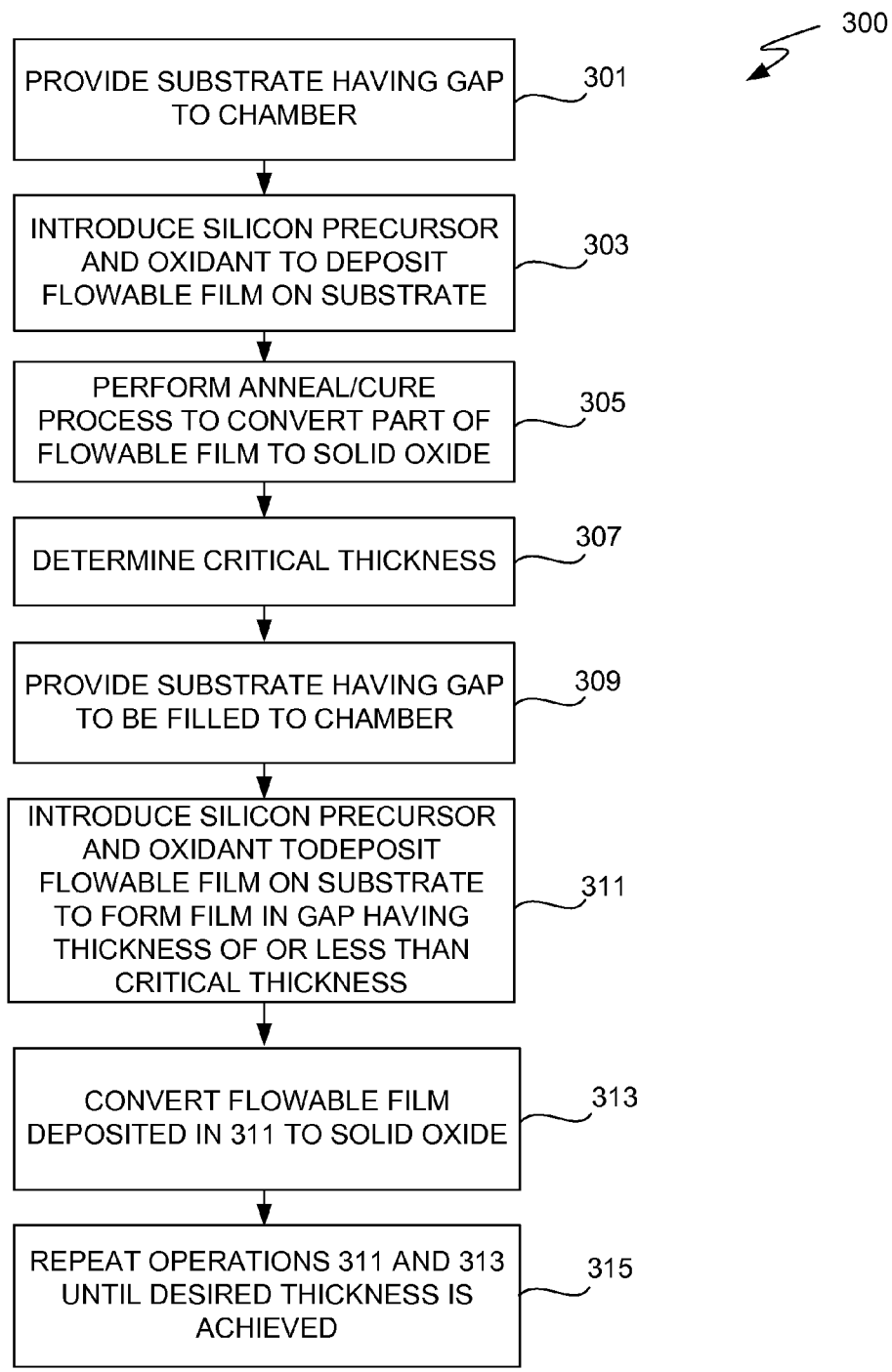
FIG. 3 is a process flow diagram depicting a method of forming a density gradient-free dielectric film using a CVD flowable film deposition process.

In certain embodiments, the gap is filled by a depositing a flowable film by CVD and then converting the flowable film to a solid silicon oxide layer. FIG. 3 is a process flow sheet depicting aspects of methods according to certain embodiments that use such a CVD process. The process begins with an operation 301 in which a substrate containing a gap is provided to a reaction chamber. In certain embodiments, this is a test substrate used to determine the critical thickness. A silicon-containing precursor and an oxidant are introduced to the reaction chamber to deposit a flowable film on the substrate in a chemical vapor deposition-type reaction. (It should be noted that the term "chemical vapor deposition" is used in this description to distinguish between a spin-on process; however, the method is not limited to a particular reaction mechanism, e.g., the reaction mechanism may involve a condensation reaction, a vapor-phase reaction producing a vapor-phase product that condenses, condensation of one or more of the reactants prior to reaction, or a combination of these.) As described in further detail below, the deposition process typically forms a soft jelly-like film with good flow characteristics, providing consistent fill. After the flowable film is deposited in the gap, a cure or anneal process in operation 305 converts the flowable film to a solid oxide (dielectric) layer. Further description on forming the flowable film and converting it to a solid oxide is provided below. Operations 303 and 305 may be performed in the same or different chambers. The anneal process fully converts only a top portion or layer of the flowable film into dense solid oxide. This top portion or layer is analyzed to determine critical thickness in an operation 307. The critical thickness is the maximum thickness for which the anneal or cure process is able to convert the film to a solid without a density gradient. It is determined by analyzing the dense upper layer resulting from operation 305. This can be done by measuring the thickness of the dense upper layer, e.g., by SEM after HF or BOE decoration. This can also be done by analyzing the composition of the film to determine the thickness of the fully-converted oxide portion, by methods including but not limited to Auger electron specstrocopy (AES), x-ray photoelectron spectroscopy (XPS), fourier-infrared transform spectroscopy (FTIR) and other techniques. It can also be done by measuring the density of the film to determine the thickness of the uniformly-dense oxide portion. It should be noted that the converting the flowable film to solid results in about 5-40% shrinkage—thus, in certain embodiments the critical thickness of the flowable film may be slightly larger than the thickness measured by one of the analysis methods to account for this shrinkage. Once the critical thickness is determined, a substrate having a gap to be filled is placed in a reaction chamber in an operation 309. A silicon-containing precursor and an oxidant are introduced to the chamber under conditions such that a flowable film is deposited and partially fills the gap in an operation 311. As indicated in FIG. 3, the thickness of the deposited flowable film is at or less than the critical thickness. After the gap is partly filled, the flowable film is converted to a solid dielectric film in an operation 313. Because the deposition in operation 309 is controlled to deposit no more than the critical thickness, the anneal or cure process used in operation 313 uniformly densifies the just deposited layer. The result is a density gradient-free dielectric layer. The anneal or cure process may occur in the same or different reaction chamber as the deposition. In certain embodiments, these operations occur in different stations or modules of a multi-station chamber or processing tool. Operations 311-313 are then repeated (as is operation 309 if necessary to re-introduce the substrate to a deposition chamber) as necessary to fill the gap, as indicated in operation 315. In many embodiments, the critical thickness for a particular type of structure or dep/anneal conditions is determined once using an initial or test structure, followed by deposition of multiple device wafers/batches.

Further details of the deposition and conversion processes referred to in FIG. 3 are given below.

Flowable Film Deposition

Deposition of flowable films to form dielectric layers is described in U.S. Pat. No. 7,074,690, U.S. patent application Ser. No. 11/447,594, filed Jun. 5, 2006, U.S. patent application Ser. No. 11/323,812, filed Dec. 29, 2005 and U.S. Provisional Patent Application No. 60/856,193, filed Nov. 1, 2006. The process gas reactants include a silicon-containing compound and an oxidant. A catalyst may also be included in some embodiments. The gases may also include one or more dopant precursors, e.g., a fluorine, phosphorous and/or boron-containing gas. Sometimes, though not necessarily, one or more inert carrier gases are present.

Suitable silicon-containing compounds include organo-silanes and organo-siloxanes. In certain embodiments, the silicon-containing compound is a commonly available liquid phase silicon source. In some embodiments, a silicon-containing compound having one or more mono, di, or tri-ethoxy, methoxy or butoxy functional groups is used. Examples include, but are not limited to, tetraoxymethylcyclotetrasiloxane (TOMCTS), octamethylcyclotetrasiloxane (OMCTS), tetraethoxysilane (TEOS), triethoxysilane (TES), trimethoxysilane (TMS or TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), triphenylethoxysilane, 1-(triethoxysilyl)-2-(diethoxymethylsilyl)ethane, tri-t-butoxylsilanol and tetramethoxy silane.

The oxidant may be any suitable oxidant capable of reacting with the silicon precursor to form the flowable film. Examples of suitable oxidants include oxygen, ozone, hydrogen peroxide and water (steam). In certain embodiments, the oxidant is a non-peroxide oxidant.

Appropriate catalysts are discussed in U.S. Provisional Patent Application No. 60/856,193. Briefly, these catalytic compounds are vaporizable and easily dissociate or ionize to form an ionic species that catalyzes the formation of the flowable film and according to various embodiments include nucleophiles, e.g., halogens ($F^-$, $Cl^-$ and $Br^-$, etc.) as well as oniums, e.g. ammonium ($NH_4^+$) and phosphonium ($PH_4^+$). Onium species that may be used include $NH_4OH$, $NH_4OAc$, $NH_3$, $(CH_3)_4NOH$, $(CH_3)_4NOAc$, $PH_3$, or any other compound that is vaporizable and readily disassociated or ionized to produce the desired ion.

In certain embodiments a chemical reagent that acts as an inhibitor may be used to slow down the reaction between the silicon and oxidant precursors. Examples of such reagents include alcohols such as ethanol, isopropyl alcohol, etc.

In certain embodiments, the gases are introduced using a liquid injection system. Typically the silicon-containing compound and the oxidant are introduced via separate inlets or are combined just prior to introduction into the reactor in a mixing bowl and/or showerhead. If used, the optional catalyst and/or optional dopant may be incorporated into one of the reactants, pre-mixed with one of the reactants or introduced as a separate reactant.

Conditions in the reactor are such that the silicon-containing compound and the oxidant react to form a condensed flowable film on the substrate. As indicated above, formation of the film may be aided by presence of a catalyst. The methods described herein are not limited to a particular reaction mechanism, e.g., the reaction mechanism may involve a condensation reaction, a vapor-phase reaction producing a vapor-phase product that condenses, condensation of one or more of the reactants prior to reaction, or a combination of these. The substrate is exposed to the process gases for a period sufficient to deposit a flowable film to fill at some of the gap. The deposition process typically forms soft jelly-like film with good flow characteristics, providing consistent fill. The deposited film may also be described herein for the purposes of discussion as a gel having liquid flow characteristics, a liquid film or a flowable film.

Chamber pressure may be between about 1-100 Torr, in certain embodiments, it is between 2 and 50 Torr. Lower pressures typically result in slower deposition rates. Substrate temperature is typically between about −20 and 100 C. In certain embodiments, temperature is between about 0 and 35 C. Pressure and temperature may be varied to adjust deposition time and film properties. In one embodiment, the temperature is about 5 C and the pressure about 10 Torr.

Reaction time depends on reaction conditions as well as the desired film thickness. Deposition rates are typically from about 100 angstroms/min to 1 micrometer/min.

Typically the silicon-containing compound and the oxidant are introduced via separate inlets or are combined just prior to introduction into the reactor. They may be delivered to the reactor through a showerhead, a dual-plenum showerhead, baffle plate, gas ring, injection tubes, or other means. Showerhead (or other gas inlet) to pedestal distance should be small to facilitate deposition. Showerhead-pedestal distance typically ranges from about 100 mil-5 inches. In some embodiments, it ranges from about 200 mil-3 inches.

In addition, to pressure and temperature, reactant flow rates may be adjusted to vary deposition rate and film characteristics. Acceptable silicon-containing precursor compound/oxidant flow ratios are very variable with examples of suitable ratios including from about 10:1 to 1:100. If used, the amount of catalyst used should be enough to adequately catalyze the reaction. In some embodiments, the silicon-containing compound and the oxidant are delivered to the reaction chamber via liquid injection system that vaporizes the liquid for introduction to the chamber. The reactants are typically delivered separately to the chamber or are combined just prior to introduction into the chamber in a mixing bowl and/or showerhead. Typical flow rates of the liquid introduced into a liquid injection system range from 0.01-10.0 mL/min per reactant. Of course, one of skill in the art will understand that optimal flow rates depend on the particular reactants, desired deposition rate, reaction rate and other process conditions.

The flowable film deposited on the substrate typically contains some combination of Si—O, Si—H and Si—OH bonds. Process conditions prevent significant incorporation of organic groups in the film. For example, in reaction between TES and steam, the chemical reaction causes formation of a flowable film containing Si—OH, Si—H and Si—O bonds, while the ethoxy group is removed as a gaseous ethanol byproduct. The byproduct and/or excess reactants may be continuously pumped out.

Film composition depends in part on the oxidant chosen, with a weaker oxidant (e.g., water) resulting in more Si—H bonds than a stronger oxidant (e.g., ozone). Using ozone will result in conversion of most of the Si—H bonds to Si—OH bonds. Water is used to form Si—O bonds in many embodiments. In particular embodiments, $H_2O$ (steam) or aqueous solutions are used as the oxidant. One example of that reaction is TES and $H_2O$.

Process conditions in the reactor are such that the reaction product condenses on the surface. In certain embodiments, this involves bringing the substrate into the chamber under "dark", i.e., non-plasma conditions, i.e., the substrate is not exposed to a plasma during the deposition phase of the process. In other embodiments, a plasma may be used prior to or during deposition.

Optional substrate pre- and post-deposition treatments may be performed. Substrate pre-treatments may be performed to wet the surface, e.g., by exposing the substrate to steam. Substrate post-treatments may be performed to induce further cross-linking of SiOH groups, e.g., by exposing the substrate to steam.

Converting the Flowable Film to a Solid Oxide Film

After the flowable film has been deposited on the substrate, the as-deposited flowable film is converted to a solid silicon oxide dielectric film. According to various embodiments, this conversion may involve a thermal, ultraviolet (UV), electron-beam (E-beam), microwave, laser or plasma anneal. It is desirable to achieve a uniform conversion of the flowable film to a solid silicon dioxide film.

According to various embodiments, the film may be converted to a solid oxide film by exposure to plasma. Oxygen, hydrogen, helium, argon and steam plasmas are examples of plasmas that may be used. The plasma may also contain one or more of these compounds. Nitrogen-containing plasmas could be used if the incorporation of nitrogen in the resulting dielectric film is desirable. Temperatures during plasma exposure are typically about 200 C or higher.

In certain embodiments, an oxygen or oxygen-containing plasma is used to facilitate conversion of the Si—H bonds into Si—O bonds. An oxygen-containing plasma may be particularly useful for flowable films that have a high number of Si—H bonds, e.g., for films formed by the reaction of TEOS and steam.

The plasma source may be any known plasma source, including radio frequency (RF) and microwave sources. In an RF plasma, plasma source power is typically at least about 3000 W. The plasma source may be an inductively-coupled high density plasma or a capacitively-coupled plasma. Also the plasma-assisted conversion may be performed with a high frequency bias power applied to the substrate.

In some embodiments, a thermal anneal may be used instead of or in addition to a plasma to convert the film into a solid oxide. Thermal annealing may be performed in any suitable ambient, such as a water vapor, oxygen, air, carbon dioxide, hydrogen, nitrogen, or inert ambient. In specific embodiments, it is desirable to conduct the thermal anneal in an oxidizing ambient to facilitate conversion of the Si—H bonds into Si—O bonds. Temperatures are typically at least about 250 C, i.e. high enough to break the Si—OH bond. For example, thermally annealing a silanol gel R—Si(OH)$_x$ results in a solid silicon dioxide $SiO_2$ film and water vapor as a by-product.

In certain embodiments, solidification operations 305 and 313 may each encompass multiple stages. For example, a first stage may be used to convert any Si—H bonds to Si—OH and Si—O bonds and a second stage used to improve film quality and convert the film to fully dense oxide (substantially free of Si—H and Si—OH bonds).

In the method described in FIG. 3, the critical thickness is determined in an operation 307, and then used to determine the thickness of film deposited in operation 311. As indicated above, the critical thickness is inversely related to ratio of the volume of film deposited to the surface area of the exposed film, and therefore depends on the feature size. As feature size decreases, this ratio increases and the critical thickness decreases. In features having aspect ratios between about 3:1 to 15:1, the critical feature width may range from about 10-100 nm. In certain embodiments, in features having aspect ratios greater than about 6:1, the critical feature width is generally less than about 0.13 μm. It should be noted that for small features, the critical thickness cannot be increased beyond a certain point by changing anneal conditions.

Figure 4:
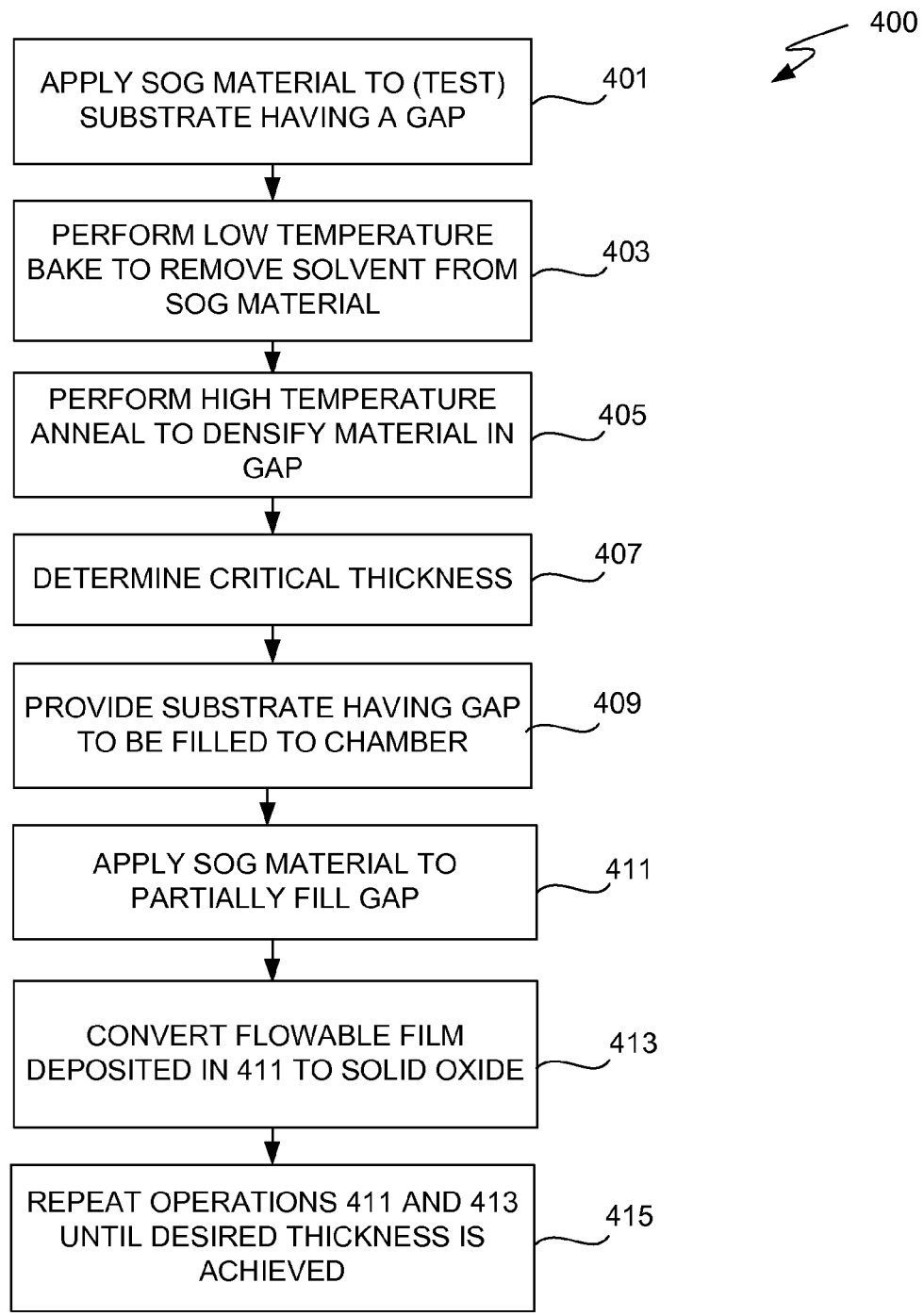
FIG. 4 is a process flow diagram depicting a method of forming a density gradient-free dielectric film using a spin-on glass process.

Also, as indicated above, in certain embodiments, spin-on deposition-anneal-spin-on deposition-anneal methods are provided. FIG. 4 is a process flowsheet showing operations in a spin-on glass (SOG) deposition method according to certain embodiments. First, in an operation 401, an SOG material is applied to substrate having a gap. The material is in a liquid state and fills the gap. A low-temperature bake is then performed to remove the solvent in an operation 403. This is then followed by a high-temperature anneal to densify the formed layer in an operation 405. The critical thickness is determined in an operation 407. As described above, the critical thickness is the maximum thickness for which the anneal or cure process is able to convert the film to a solid without a density gradient. It is determined by measuring the thickness of the dense upper layer resulting from operation 405. This can be done, e.g., by SEM after HF or BOE decoration. It can also be done by analyzing the composition of the film to determine the thickness of the fully-converted oxide portion, e.g. by Auger electron specstrocopy (AES), x-ray photoelectron spectroscopy (XPS), fourier-infrared transform spectroscopy (FTIR) or other techniques. It can also be done by measuring the density of the film to determine the thickness of the uniformly-dense oxide portion. The high temperature anneal may result in about 5-40% shrinkage—thus, in certain embodiments the critical thickness of the applied SOG layer may be slightly larger than the thickness determined by the above analysis to account for this shrinkage. Once the critical thickness is determined, a substrate having a gap to be filled is placed in a reaction chamber in an operation 409. A SOG material is applied to partially fill the gap in an operation 411. The thickness of the applied film in the gap is at or less than the critical thickness. After the gap is partly filled, a low-temperature bake is performed in an operation 413 to remove the solvent. This is then followed by a high temperature anneal to densify the formed layer in an operation 415. Because the SOG application in operation 411 is controlled to form no more than the critical thickness the high-temperature anneal process used in operation 415 uniformly densifies the just-applied layer. The result is a density gradient-free dielectric layer. Operations 411-413 are then repeated as necessary to fill the gap, as stated in operation 415.

Any appropriate SOG material known in the art may be applied as the SOG layer. These include silazanes and siloxanes. The low temperature bake may be performed at temperatures suitable to remove the solvent, e.g., in the range of 50-350 C. The high temperature anneal is typically performed at a temperature of 600-1200 C, e.g. 700-1000 C. The spin on and anneal processes are typically performed in different chambers.

In another embodiment, a flowable film is selectively deposited in gaps. Selective deposition of a flowable film in gaps is described in U.S. Pat. No. 7,074,096, hereby incorporated by reference. Briefly, the substrate is exposed to a vapor phase precursor that selectively condenses in narrow dimension gaps due to the Kelvin effect. The liquid regions of the precursor are converted into a solid-phase deposition material. This conversion may be achieved physically, for example, simply by solidification, or chemically by reacting the precursor liquid regions with another material to produce the solid material or by decomposing or polymerizing the precursor using, for example, thermal or ultraviolet means. In certain embodiments, a critical thickness is determined and the selective deposition/conversion process in repeated multiple times to fully fill the gap.

While the above description discusses the invention in the context of integrated circuit fabrication, there are numerous applications of the present invention, both inside and outside the integrated circuit fabrication arena.

Apparatus

The methods of the present invention may be performed on a wide-range of reaction chambers. The methods may be implemented on any chamber equipped for deposition of dielectric film, including HDP-CVD reactors, PECVD reactors, SACVD reactors, any chamber equipped for CVD reactions, and chambers used for oxide PDL (pulsed deposition layers).

Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation or vertical translation). While in process, each wafer is supported and optionally clamped by a pedestal, electrostatic chuck, mechanical chuck and/or other wafer holding apparatus. For certain operations in which the wafer is to be heated or cooled, the apparatus may include a temperature control plate including a heater or chiller.

In certain embodiments, the present invention may be implemented in a HDP CVD reactor. An example of a suitable reactor is the Speed™ reactor, available from Novellus Systems Inc. of San Jose, Calif. In certain embodiments, the present invention may be implemented in a PECVD reactor. Examples of suitable reactors are the Sequel™ reactor and the Vector™ reactor, both available from Novellus Systems Inc. of San Jose, Calif. In certain embodiments, the present invention may be implemented in a CVD chamber equipped for metal and/or dielectric deposition. An example of a suitable reactor is the Altus™ reactor available from Novellus Systems of San Jose, Calif. In certain embodiments, the present invention may be implemented in a chamber equipped for atomic layer deposition (ALD), pulsed deposition layer (PDL), or pulsed nucleation layer (PNL) depositions. Examples of such reactors are the Altus DirectFill™ reactor and the PDL Oxide reactor, both available from Novellus Systems Inc. of San Jose, Calif.

In certain embodiments, the deposition and conversion operations are performed in the same reaction chamber. In other embodiments, the deposition and conversion operations are performed on different stations in the same reaction chamber. In other embodiments, the deposition may be performed in a first chamber and then transferred to a second chamber for a thermal, plasma or other type of anneal. For example, reactors that are configured for plasma reactions may be used for both the deposition and plasma anneal operations. Other reactors may be used for both the deposition and thermal anneal operations.

Figure 5:
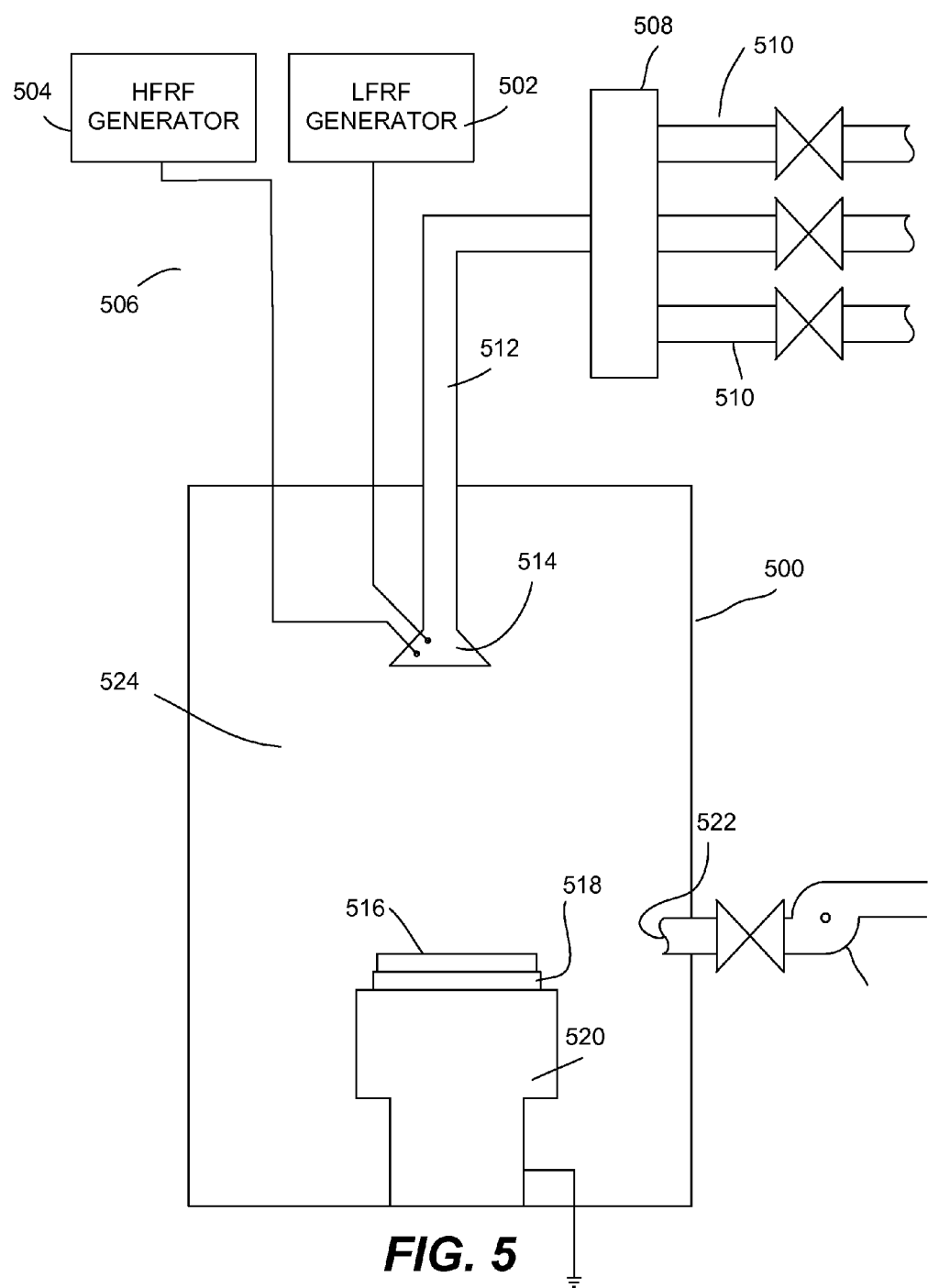
FIGS. 5 and 6 are block diagrams depicting some components of various reactors suitable for performing certain embodiments.

FIG. 5 shows an example of a reactor that may be used in accordance with certain embodiments of the invention. The reactor shown in FIG. 5 is suitable for both the deposition of a flowable film and conversion to a solid film, for example, by plasma anneal. As shown, a reactor 500 includes a process chamber 524, which encloses other components of the reactor and serves to contain the plasma generated by a capacitor type system including a showerhead 514 working in conjunction with a grounded heater block 520. A low-frequency RF generator 502 and a high-frequency RF generator 504 are connected to showerhead 514. The power and frequency are sufficient to generate a plasma from the process gas, for example, 400-700 W total energy for a deposition, and a higher power for a plasma anneal. In one implementation of the present invention, the generators are not used during deposition of the flowable film. During the plasma anneal step, one or both generators may be used. For example, in a typical process, the high frequency RF component is generally between 2-60 MHz; in a preferred embodiment, the component is 13.56 MHz.

Within the reactor, a wafer pedestal 518 supports a substrate 516. The pedestal typically includes a chuck, and a fork or lift pins to hold and transfer the substrate during and between the deposition and/or plasma treatment reactions. The chuck may be an electrostatic chuck, a mechanical chuck, a vacuum chuck or various other types of chuck as are available for use in the industry and/or research.

The process gases are introduced via inlet 512. Multiple source gas lines 510 are connected to manifold 508. The gases may be completely premixed, partially premixed or not mixed. Appropriate valving and mass flow control mechanisms are employed to ensure that the correct gases are delivered with controllable flow rates during the deposition and plasma treatment phases of the process. In case the chemical precursor(s) is delivered in the liquid form, liquid flow control and injection mechanisms are employed. The liquid is then vaporized and mixed with other inert or reactive process gases in a mixing bowl or manifold heated above its vaporization point before reaching the deposition chamber. The temperature of the mixing bowl/manifold lines should be maintained at levels above the vaporization temperature of the process gases. Temperatures at or above about 80 C at pressures at or less than about 20 Torr usually suffice for many common silicon oxide precursors.

Process gases exit chamber 500 via an outlet 522. A vacuum pump (e.g., a one or two stage mechanical dry pump and/or a turbomolecular pump) typically draws process gases out and maintains a suitably low pressure within the reactor by a closedloop-controlled flow restriction device, such as a throttle valve or a pendulum valve.

It should be noted that the apparatus depicted in FIG. 5 is but one example of an apparatus that may be used to implement this invention.

Figure 6:
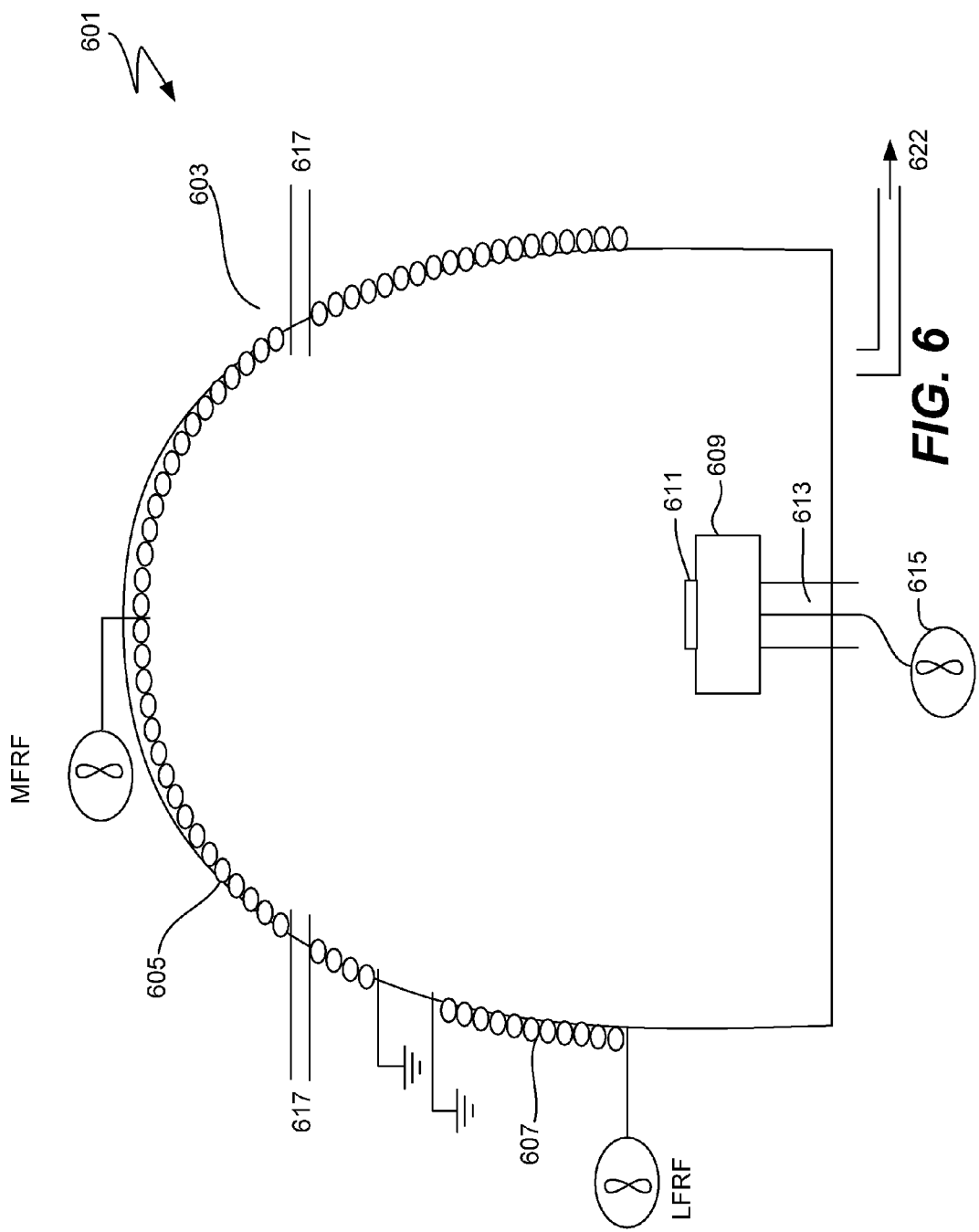

FIG. 6 provides a simple block diagram depicting various reactor components as may be arranged in an HDP-CVD reactor that may be used in accordance with the invention. As shown, a reactor 601 includes a process chamber 603 which encloses other components of the reactor and serves to contain the plasma. In one example, the process chamber walls are made from aluminum, aluminum oxide, and/or other suitable material. The embodiment shown in FIG. 6 has two plasma sources: top RF coil 605 and side RF coil 607. Top RF coil 605 is a medium frequency RF (MFRF) coil and side RF coil 607 is a low frequency RF (LFRF) coil. In the embodiment shown in FIG. 6, MFRF frequency may be from 430-470 kHz and LFRF frequency from 340-370 kHz. However, the invention is not limited to operation in reaction chambers with dual sources, nor even RF plasma sources. Any suitable plasma source or sources may be used.

Within the reactor, a wafer pedestal 609 supports a substrate 611. The pedestal typically includes a chuck (sometimes referred to as a clamp) to hold the substrate in place during the deposition reaction. The chuck may be an electrostatic chuck, a mechanical chuck, a vacuum chuck or various other types of chuck as are available for use in the industry and/or research. A heat transfer subsystem including a line 613 for supplying heat transfer fluid controls the temperature of substrate 611. The wafer chuck and heat transfer fluid system can facilitate maintaining the appropriate wafer temperatures during deposition and plasma anneal.

Optionally, a high frequency RF (HFRF) source 615 serves to electrically bias substrate 611 and draw charged precursor species onto the substrate during the deposition reaction. Electrical energy from source 615 is coupled to substrate 611 via an electrode or capacitive coupling, for example. Note that the bias applied to the substrate need not be an RF bias. Other frequencies and DC bias may be used as well.

The process gases are introduced via one or more inlets 617. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring located around the perimeter of the chamber. Injectors may be connected to the primary gas ring to direct at least some of the gases or gas mixtures into the chamber and/or toward the substrate. The flow dynamics caused by a process gas entering the chamber will itself cause the gas to disperse in all directions—including toward the substrate. Process gases exit chamber 603 via an outlet 622. A vacuum pump (e.g., a turbomolecular pump) typically draws process gases out and maintains a suitable pressure within the reactor.

In certain embodiments, high-cost features of the Speed™ or other HDP-CVD tool may be eliminated. For example, the present invention may be implemented on an HDP-CVD reactor without a dome and/or turbo-molecular pumps.

As indicated, the reactors depicted in FIGS. 5 and 6 are merely exemplary. For example, while FIGS. 5 and 6 provide examples of reactors that may be used to deposit the flowable film and provide inductively or capacitatively coupled plasma for an anneal operation, in certain embodiments wherein nonplasma thermal anneals are performed, the plasma generation mechanisms are not necessary. Also, as described above, the reactants are injected via liquid injectors in many embodiments. In certain embodiments, the CVD reactor may include a baffle assembly to increase reactor residence time and provide uniform delivery of the gases. An example of a baffle plate assembly as used in accordance with the invention is described the above-referenced commonly-assigned U.S. patent application Ser. No. 11/323,812.

Figure 7:
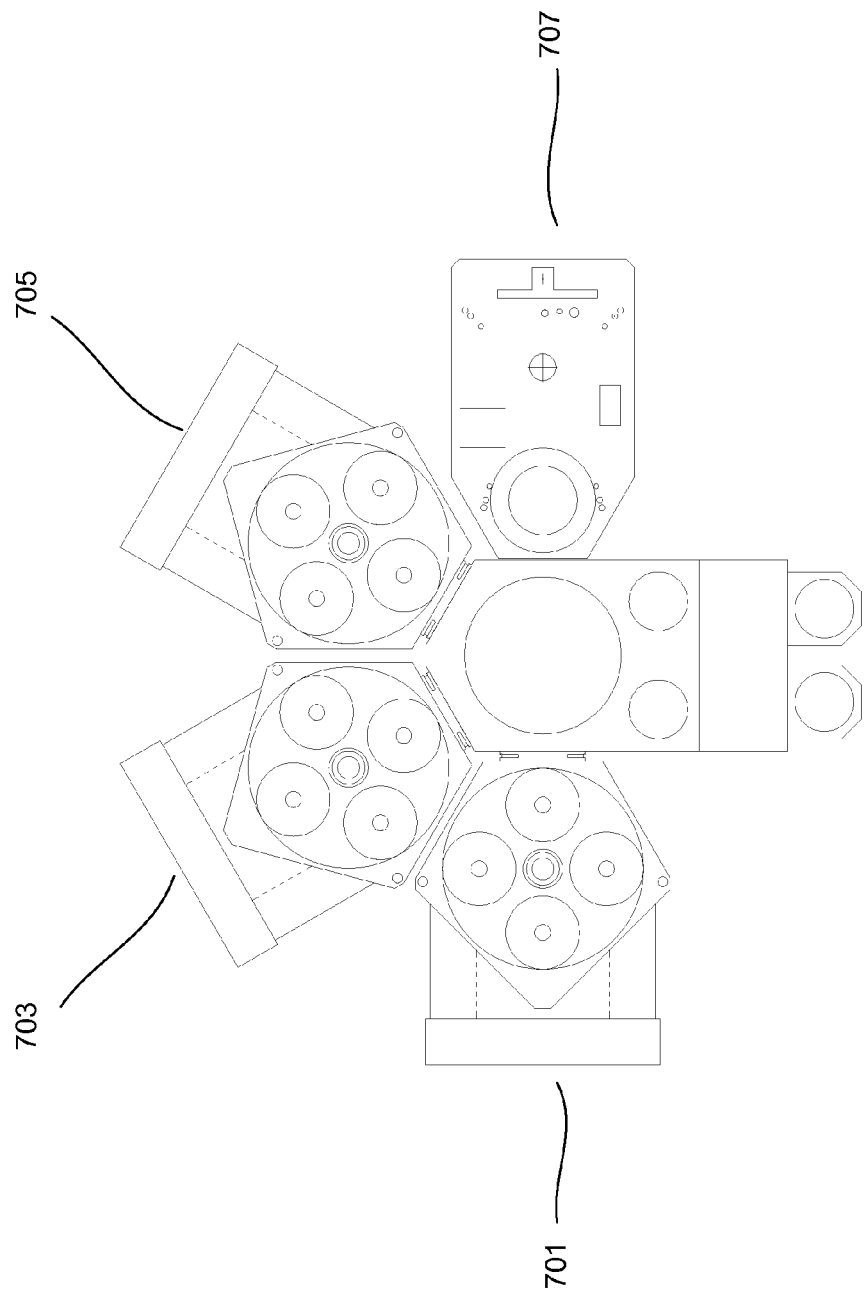
FIG. 7 is a diagram depicting components of a multi-module reaction chamber suitable for performing certain embodiments.

In certain embodiments, a multi-module apparatus having one or more modules for a flowable film deposition and anneal/cure as well as an HDP module may be used. An example of such an apparatus is shown in FIG. 7. In this example, modules 701-705 are multi-station modules for low-temperature thermal CVD for deposition a flowable film as described above. Module 707 is an HDP-CVD module that may be used for plasma curing (e.g., in the anneal operations described above) as well as for other processes including plasma etch-back and cap deposition.

Conventional spin-on deposition apparatuses may be used for SOG layer embodiments. In a particular embodiment, the spin-on deposition apparatuses may comprise heated pedestals or hot plates to anneal the SOG layer. In other embodiments, stand-alone annealing chambers, sometimes called ovens, may be used for anneal of the SOG films or any of the flowable films.

EXPERIMENTAL

The following examples provide details illustrating aspects of the present invention. These examples are provided to exemplify and more clearly illustrate these aspects of the invention and are in no way intended to be limiting.

Effect of Film Thickness on Density

A deposition process was performed to deposit flowable film on a substrate containing width 35 nm and aspect ratio 7:1. About 81 nm of flowable film was deposited using the following deposition process:

The wafer was allowed to cool to 8° C. at 10 ton with a constant flow of He at 2 SLM before exposing to steam (1.00 mL/min) during a pressure ramp down to 4 torr over a period of 10 s. The wafer was then exposed to TriMOS (1.30 mL/min) and steam (0.13 mL/min) for a period of 20 s during which time the He-carrier gas was flowing at 2 SLM. The pressure was then raised to 50 torr over a period of 25 s while maintaining the gas flow (TriMOS: 1.3 mL/min, Steam: 0.13 mL/min and He-carrier gas: 2 SLM). The gas flow was shut off immediately once the pressure reached 50 torr.

Figure 8:
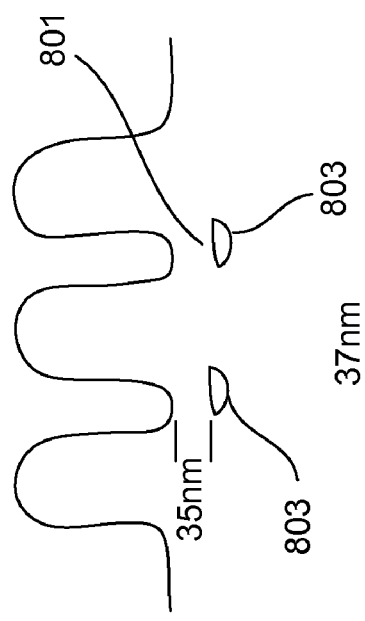
FIG. 8 is a rendering of an SEM image obtained after a flowable film deposition/plasma anneal process.

The flowable film was then converted to a solid oxide by a HDP cure process (4500 W/500 sccm $O_2$/2 min). Density of the resulting layer was then measured by performing wet-etch (100:1 hydrofluoric acid) and evaluating an SEM image. FIG. 8 shows a rendering of the resulting SEM image. The thickness of the dense layer 801 is about 35 nm. The SEM image shows an etched portion 803 for films more than 35 nm below the film surface—indicating that the wet etch rate (WER) for film more than 35 nm below the fill surface is very high. This indicates that the density of this portion of the film is low.

Multiple Deposition/Cure Cycles

Figure 9B:
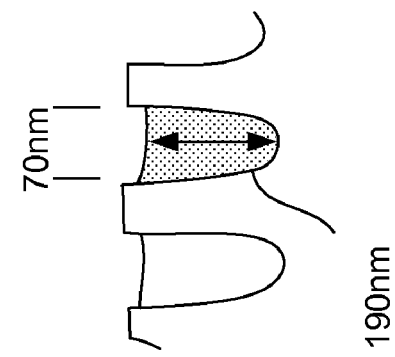
FIGS. 9A and 9B are renderings of SEM images obtained after multiple cycles of a flowable film deposition/anneal processes.
Figure 9A:
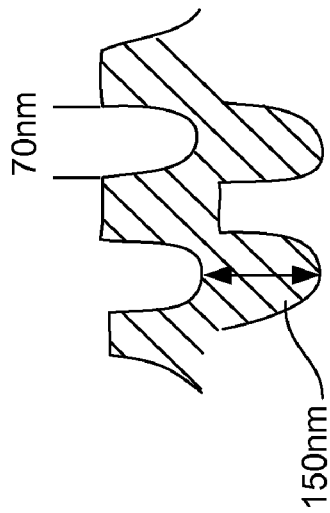

A two-stage deposition/cure process was performed on a substrate having gaps of width 70 nm and aspect ratio 3:1. Deposition conditions were as described in the above example. A thermal anneal process at 900 C in a vacuum (60 min) was performed. About 150 nm was achieved in the first two deposition/cure cycles. A wet etch process (6:1 buffered oxide etch) was performed followed by SEM imaging. FIG. 9A shows a rendering of the SEM image. A uniformly dense film (no density gradient) of about 150 nm is deposited in the gap.

A three stage dep/cure process was performed on a substrate having 70 nm gaps. A uniformly dense film of 190 nm was achieved. FIG. 9B shows a rendering of the obtained SEM image.

While this invention has been described in terms of a few preferred embodiments, it should not be limited to the specifics presented above. Many variations on the above-described preferred embodiments, may be employed. Therefore, the invention should be broadly interpreted with reference to the following claims.

The invention claimed is:

1. A method of filling a gap on a substrate with density gradient-free dielectric film, comprising:
    a) providing a substrate having a gap to chamber, said gap having a depth d;
    b) forming a first portion of a dielectric film in the gap such that the gap is partially filled about equal to or less than a critical thickness, said critical thickness less than depth d;
    c) densifying the first portion of the film such that it is substantially density gradient-free and removing Si—H bonds from the first portion of the film;
    d) after densifying the first portion of the film, forming a second portion of the dielectric film in the gap, the thickness of the second portion about equal to or less than the critical thickness; and
    e) densifying the second portion of the film such that it is substantially density gradient-free and removing Si—H bonds from the second portion of the film; wherein (b) and (d) comprise introducing process gases comprising a silicon-containing precursor and an oxidant to a reaction chamber and exposing the substrate to the process gas under conditions such that a condensed flowable film forms on the substrate surface and partially fills the gap.

2. The method of claim 1 further comprising repeating formation and densification operations until the gap is substantially filled with density gradient-free dielectric film, wherein each of said formation operations comprises forming a portion of film having a thickness of about equal to or less than the critical thickness and each of said densification operations comprises densifying that portion of the film such that it is substantially density gradient- and void-free.

3. The method of claim 1 wherein (c) and (e) comprise a high temperature thermal anneal.

4. The method of claim 1 wherein (c) and (e) comprise at least one of a plasma anneal, a thermal anneal, an electron beam anneal or an ultraviolet (UV)-enhanced anneal.

5. The method of claim 1 wherein (c) and (e) comprise an anneal in an oxidative environment.

6. The method of claim 1 wherein the critical thickness is between about 10 and 100 nanometers.

7. A method of filling a gap on a substrate with a dielectric film comprising:
    a) providing a substrate having a gap to a reaction chamber;
    b) introducing process gases comprising a silicon-containing precursor and an oxidant to the reaction chamber;
    c) exposing the substrate to the process gases under conditions such that a condensed flowable film deposits on the substrate surface and partially fills the gap to no more than a critical thickness;
    d) converting the flowable film to a solid oxide layer, wherein said converting comprising removing Si—H bonds from the flowable film, wherein the solid oxide does not have a density gradient; and
    e) after performing (c) and (d), repeating (c) and then (d) at least once to fill the gap with a solid oxide layer of uniform density.

8. The method of claim 7 wherein the oxidant is selected from water vapor, ozone and a peroxide.

9. The method of claim 7 wherein the oxidant is a non-peroxide oxidant.

10. The method of claim 7 wherein (d) comprises one or more of a thermal, ultraviolet (UV), electron-beam (E-beam), microwave, laser or plasma anneal.

11. The method of claim 7 wherein (d) comprises an anneal performed in an oxidative environment.

12. The method of claim 7 wherein (d) comprises an oxygen-containing plasma anneal.

13. The method of claim 7 wherein (d) comprises a multi-stage thermal anneal.

14. The method of claim 7 wherein the deposition reaction occurs in non-plasma conditions.

15. The method of claim 7 wherein the process gases further comprise a catalyst.

16. The method of claim 14 wherein the catalyst compound is selected from a halogen-containing compound and an onium compound.

17. The method of claim 7 wherein the deposition is non-selectively deposited in the gap and the substrate surrounding the gap.

18. A method of filling a gap on a substrate with dielectric film, comprising:
   providing a substrate having a gap to chamber, said gap having a depth d;
   introducing silicon-containing precursor and oxidant process gases into the chamber to form a flowable oxide layer in the gap by vapor deposition such that the gap is partially filled;
   exposing the first portion of the film to an oxygen-containing plasma to densify the first portion of film and remove Si—H bonds from the film;
   after densifying the first portion of the film, introducing silicon-containing precursor and oxidant process gases into the chamber to form a form a flowable oxide layer vapor deposition; and
   exposing the second portion of the film to an oxygen-containing plasma to densify the second portion of the film and remove Si—H bonds from the film.

* * * * *